United States Patent
Park et al.

(10) Patent No.: US 8,816,323 B2
(45) Date of Patent: Aug. 26, 2014

(54) NITRIDE-BASED LIGHT EMITTING DEVICE WITH EXCELLENT LIGHT EMITTING EFFICIENCY USING STRAIN BUFFER LAYER

(71) Applicant: Iljin LED Co., Ltd., Ansan-si (KR)

(72) Inventors: Jung-Won Park, Yongin-si (KR); Sung-Hak Lee, Incheon (KR)

(73) Assignee: Iljin LED Co., Ltd., Ansan-si, Gyeonggi-do (KR)

( * ) Notice: Subject to any disclaimer, the term of this patent is extended or adjusted under 35 U.S.C. 154(b) by 0 days.

(21) Appl. No.: 13/726,957

(22) Filed: Dec. 26, 2012

(65) Prior Publication Data

US 2013/0168638 A1  Jul. 4, 2013

(30) Foreign Application Priority Data

Dec. 30, 2011 (KR) .................. 10-2011-0147243

(51) Int. Cl.
*H01L 33/06* (2010.01)
*H01L 33/04* (2010.01)
*H01L 33/12* (2010.01)
*H01L 33/32* (2010.01)

(52) U.S. Cl.
CPC .............. *H01L 33/06* (2013.01); *H01L 33/32* (2013.01); *H01L 33/04* (2013.01); *H01L 33/12* (2013.01)
USPC .......................................................... 257/13

(58) Field of Classification Search
USPC ........................................................ 257/13
See application file for complete search history.

(56) References Cited

U.S. PATENT DOCUMENTS

| | | | |
|---|---|---|---|
| 8,168,986 B2 * | 5/2012 | Nishinaka et al. | 257/79 |
| 2005/0045895 A1 | 3/2005 | Emerson et al. | |
| 2007/0243702 A1 * | 10/2007 | Nijhawan et al. | 438/602 |
| 2009/0090901 A1 | 4/2009 | Kim | |
| 2011/0073892 A1 * | 3/2011 | Kyono | 257/98 |
| 2012/0104360 A1 * | 5/2012 | Hardy et al. | 257/18 |

FOREIGN PATENT DOCUMENTS

KR   10-2009-0002567   1/2009

OTHER PUBLICATIONS

J. Wu et al., Small band gap bowing in $In_{1-x}Ga_xN$ alloys, Applied Physics Letters, Jun. 24, 2002, pp. 4741-4743, vol. 80, No. 25.
Shi Jong Leem et al., The effect of the low-mole InGaN structure and InGaN/GaN strained layer superlattices on optical performance of multiple quantum well active layers, Journal of Crystal Growth, 2008, pp. 103-106, vol. 311.
European Search Report dated May 21, 2014.

* cited by examiner

*Primary Examiner* — Thao P Le
(74) *Attorney, Agent, or Firm* — Lowe Hauptman & Ham, LLP

(57) ABSTRACT

The nitride-based light emitting device according to one embodiment includes a first nitride semiconductor layer doped with a first conductive impurity; a strain buffer layer formed on the first nitride semiconductor layer and comprised of InGaN; an active layer formed on the strain buffer layer and having a multi-quantum well structure in which a quantum-well layer and a quantum-barrier layer are alternately stacked one above another; and a second nitride semiconductor layer formed on the active layer and doped with a second conductive impurity opposite to the first conductive impurity, wherein the ratio B/A satisfies $1.4<B/A<6.1$, where A is the product of an average indium content of the strain buffer layer and a thickness of the strain buffer layer and B is the product of an average indium content of the active layer and a thickness of the active layer.

6 Claims, 3 Drawing Sheets

NITRIDE-BASED LIGHT EMITTING DEVICE WITH EXCELLENT LIGHT EMITTING EFFICIENCY USING STRAIN BUFFER LAYER

CROSS-REFERENCE TO RELATED APPLICATION

This application claims the benefit under 35 U.S.C. §119 of Korean Patent Application No. 10-2011-0147243, filed on Dec. 30, 2011 in the Korean Intellectual Property Office, the entirety of which disclosure is incorporated herein by reference.

BACKGROUND

1. Technical Field

The present invention relates to a nitride-based light emitting device, and more particularly, to a nitride-based light emitting device which can relieve strain in an active layer to improve light emitting efficiency.

2. Description of the Related Art

Generally, nitride semiconductor light emitting devices may generate light in a wide range including UV, blue and green ranges. In particular, GaN-based nitride semiconductor light emitting devices are applied to optical devices for blue or green light emitting diodes (LED), high speed switching devices, such as metal semiconductor field effect transistors (MESFET), hetero junction field effect transistors (HFET), and the like, and high output devices.

Such a nitride-based semiconductor light emitting device has a hetero structure wherein an active layer of a multi-quantum well (MQW) structure having InGaN quantum-well layers is interposed between an n-type nitride semiconductor and a p-type nitride semiconductor. Here, the wavelengths of light such as blue, green and the like are generally determined according to the indium (In) content in the InGaN quantum-well layers.

The MQW structure active layer comprises plural pairs of an InGaN quantum-well layer and a GaN quantum-barrier layer. However, the MQW active layer undergoes severe strain between the InGaN well layer and the GaN barrier layer due to lattice mismatch between InGaN and GaN. Such strain generates a large piezoelectric field in the active layer, causing reduction of internal quantum efficiency of the active layer.

In addition, strain between the InGaN quantum-well layer and the GaN quantum-barrier layer causes generation of V-pits in the active layer and provides a rough interface between the well layer and the barrier layer when forming the active layer by stacking the well layers and the barrier layers, whereby crystallinity of the active layer can be deteriorated, thereby making it difficult to fabricate a highly efficient light emitting device.

Korean Patent Publication No. 10-2009-0002567A (published on Jan. 9, 2009) discloses a nitride-based semiconductor light emitting device wherein an InGaN relief layer having a high indium content is formed between an n-type contact layer and an active layer to improve light emitting efficiency by relieving strain between the well layer and the barrier layer in the active layer.

BRIEF SUMMARY

Therefore, the present invention is aimed at providing a nitride-based light emitting device, which can relieve strain due to lattice mismatch between a quantum-well layer and a quantum-barrier layer in an active layer, thereby improving light emitting efficiency.

In accordance with one aspect, the present invention provides a nitride-based light emitting device, which includes: a first nitride semiconductor layer doped with a first conductive impurity; a strain buffer layer formed on the first nitride semiconductor layer and comprised of InGaN; an active layer formed on the strain buffer layer and having a multi-quantum well structure in which a quantum-well layer and a quantum-barrier layer are alternately stacked one above another; and a second nitride semiconductor layer formed on the active layer and doped with a second conductive impurity opposite to the first conductive impurity, wherein the ratio B/A satisfies $1.4 < B/A < 6.1$, where A is the product of an average indium content of the strain buffer layer and a thickness of the strain buffer layer and B is the product of an average indium content of the active layer and a thickness of the active layer.

According to the present invention, the nitride-based light emitting device includes at least one strain buffer layer under an active layer so as to minimize stress in the active layer through adjustment of the average indium contents in these layers and the thicknesses of these layers.

With this structure, the nitride-based light emitting device according to the present invention may have improved light emitting efficiency through improvement of internal quantum efficiency within the active layer.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
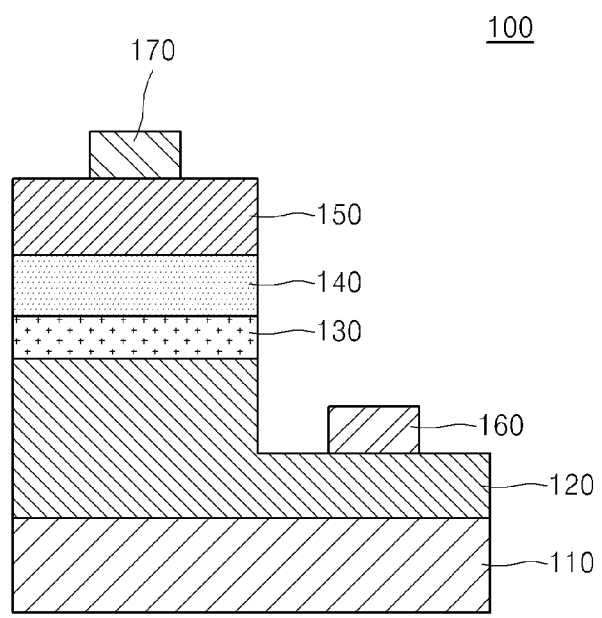
FIG. 1 is a sectional view of a nitride-based light emitting device in accordance with one embodiment of the present invention.
Figure 2:
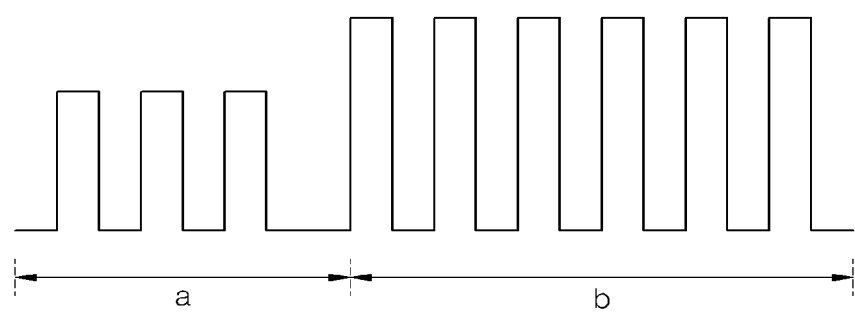
FIG. 2 shows indium profiles of an active layer and a strain buffer layer in the nitride-based light emitting device of FIG. 1, in accordance with one embodiment of the present invention.

Exemplary embodiments of the present invention will now be described in detail with reference to the accompanying drawings. However, it should be understood that the present invention is not limited to the following embodiments and may be embodied in different ways, and that the embodiments are provided for complete disclosure and thorough understanding of the invention by those skilled in the art. The FIG. 1 is a sectional view of a nitride-based light emitting device in accordance with one embodiment of the present invention; FIG. 2 shows indium profiles of an active layer and a strain buffer layer in the nitride-based light emitting device of FIG. 1, in accordance with one embodiment of the present invention; and FIG. 3 shows indium profiles of the active layer and the strain buffer layer in the nitride-based light emitting device of FIG. 1, in accordance with another embodiment of the present invention.

Figure 3:
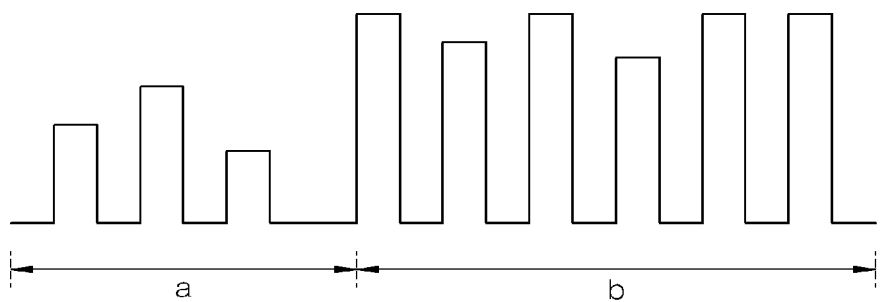
FIG. 3 shows indium profiles of the active layer and the strain buffer layer in the nitride-based light emitting device of FIG. 1, in accordance with another embodiment of the present invention.

Referring to FIG. 1 to FIG. 3, a nitride-based light emitting device 100 according to this embodiment includes a first nitride semiconductor layer 120, a second nitride semiconductor layer 150, an active layer 140 interposed between the first and second semiconductor layers 120, 150, and a strain buffer layer 130 interposed between the first nitride semiconductor layer 120 and the active layer 140.

The nitride-based light emitting device 100 may further include a first electrode 160 electrically connected to the first nitride semiconductor layer 120 and a second electrode 170 electrically connected to the second nitride semiconductor layer 150.

In addition, the nitride-based light emitting device 100 may include a substrate 110 under the first nitride semiconductor layer 120. Further, although not shown in the drawings, a buffer layer, a non-doped nitride layer, and the like may be formed between the substrate 110 and the first nitride semiconductor layer 120.

As shown in FIG. 1, the nitride-based light emitting device 100 is a light emitting structure wherein the first nitride semiconductor layer 120, the strain buffer layer 130, the active layer 140, the second nitride semiconductor layer 150 and the second electrodes 170 are sequentially formed on the substrate 110, and the first electrode 160 is formed on exposed surface of the first nitride semiconductor layer 120.

Such a nitride-based light emitting device 100 emits light through recombination of generated carriers (electrons and holes) in a p-n junction of semiconductors.

Here, the substrate 110 may be a substrate for growth of a semiconductor crystal. For example, the substrate 110 may be a substrate formed of sapphire, SiC, $MgAl_2O_4$, MgO, $LiAlO_2$, $LiGaO_2$, GaN, and the like. The sapphire is a crystal body of hexa-rhombo (R3c) symmetry. The sapphire has a lattice constant of 13.001 Å in c-axis orientation, and a lattice distance of 4.758 Å in a-axis orientation; and has a C-plane (0001), an A-plane (1120) and an R-plane (1102). Here, the C-plane of the sapphire substrate allows a nitride thin film to be grown easily and is stable even at high temperatures, and thus it is predominantly utilized as a substrate for nitride growth. The substrate 110 may utilize a patterned sapphire substrate for improvement of luminous efficacy.

The first nitride semiconductor layer 120 may be represented by the formula $Al_xIn_yGa_{(1-x-y)}N$ (where $0 \le x \le 1$, $0 \le y \le 1$, $0 \le x+y \le 1$), and include, for example, GaN, AlGaN, InGaN, and the like, which are doped with n-type impurities. The first conductive impurity doped into the first nitride semiconductor layer 120 may be, for example, n-type impurities, such as Si, Ge, Se, Te, and the like.

Like the first nitride semiconductor layer 120, the second nitride semiconductor layer 150 may be represented by the formula $Al_xIn_yGa_{(1-x-y)}N$ (where $0 \le x \le 1$, $0 \le y \le 1$, $0 \le x+y \le 1$) and include, for example, GaN, AlGaN, InGaN, and the like, which are doped with p-type impurities. The second conductive impurity doped into the second nitride semiconductor layer 150 may be, for example, p-type impurities, such as Mg, Zn, Be, and the like.

The first and second conductivity type semiconductor layers 120, 150 may be grown by a process known in the art, such as metal-organic chemical vapor deposition (MOCVD), molecular beam epitaxy (MBE), hydride vapor phase epitaxy (HVPE), and the like. When the first nitride semiconductor layer 120 is an n-type nitride semiconductor layer and the second nitride semiconductor layer 150 is a p-type nitride semiconductor layer, the first nitride semiconductor layer 120 will emit electrons and the second nitride semiconductor layer 150 will emit holes upon application of voltage.

The active layer 140 is formed between the first nitride semiconductor layer 120 and the second nitride semiconductor layer 150 and emits light of certain energy through recombination of electrons and holes. The active layer 140 may have a multi-quantum well (MQW) structure in which a plurality of quantum-well layers and a plurality of quantum-barrier layers are alternately stacked one above another.

The active layer 140 is formed of a material having an energy band-gap dependent on wavelengths of light to be emitted therefrom. For example, in order to emit blue light having wavelengths of 460~470 nm, the multi-quantum well structure of the active layer may be formed of pairs of InGaN well layer/GaN barrier layer. Here, the well layer may be represented by $In_xGa_{1-x}N$ ($0 < x \le 1$).

For example, to allow the active layer 140 of the multi-quantum well structure to emit blue light in the wavelength range of 440~470 nm, the active layer may be formed of InGaN having an average indium content of 10~15 atom %.

However, in the active layer 140 having the multi-quantum well structure formed of the pairs of InGaN well layer/GaN barrier layer, large strain occurs between the InGaN well layer and the GaN barrier layer due to lattice mismatch between InGaN and GaN.

This strain creates a large piezoelectric field in the active layer 140, causing deterioration of internal quantum efficiency of the active layer 140. Accordingly, there is a need to relieve strain in the active layer 140 in order to improve light emitting efficiency of the nitride-based light emitting device 100.

In this embodiment of the invention, the strain buffer layer 130 is formed under the active layer 140. That is, the strain buffer layer 130 is interposed between the n-type semiconductor layer 120 and the active layer 140.

According to this embodiment, the strain buffer layer 130 serves to relieve stress in the active layer 140 and will be defined by all layers containing indium, the content of which is less than an average indium content in the active layer 140.

Specifically, the strain buffer layer 130 is comprised of InGaN. Further, the strain buffer layer 130 has a lower average indium content than the active layer 140. Here, the strain buffer layer 130 may be represented by $In_xGa_{1-x}N$ ($0 < x \le 1$).

The strain of the active layer 140 may be minimized by adjusting the thickness and the indium content in each of the strain buffer layer 130 and the active layer 140. That is, a principle wherein the average indium content increases with decreasing thickness of the quantum-barrier layer is applied. However, if the indium content in the strain buffer layer 130 is excessively high, there can be a problem of deterioration in strain characteristics of the active layer 140.

In particular, this embodiment of the present invention provides conditions for achieving light emitting efficiency approaching 100% by minimizing strain of the active layer 140 with reference to Table 1 below. In this embodiment, the nitride-based light emitting device is characterized in that the ratio B/A satisfies 1.4<B/A<6.1, where A is the product of an average indium content of the strain buffer layer 130 and a thickness of the strain buffer layer 130 and B is the product of an average indium content of the active layer 140 and a thickness of the active layer 140.

Test results showed that, when the ratio was in the range of 1.4<B/A<6.1, the light emitting device had high light output and when the ratio was not in this range, the light emitting device had relatively low light output.

Next, one example of the strain buffer layer 130 according to this embodiment will be described together with indium profiles in the strain buffer layer 130 and the active layer 140. However, it should be understood that the present invention is not limited to the following example so long as the active layer and the strain buffer layer are formed to have the ratio B/A satisfying 1.4<B/A<6.1.

The strain buffer layer 130 is formed of InGaN, the indium content of which is lower than that of the active layer 140 in order to relieve strain of the active layer 140. Here, the well layer may be represented by $In_xGa_{1-x}N$ (0<x≤1).

As in the active layer 140, the strain buffer layer 130 may have a multi-quantum well (MQW) structure in which a plurality of quantum-well layers and a plurality of quantum-barrier layers are alternately stacked one above another. In this case, the multi-quantum well structure of the strain buffer layer may be formed of pairs of InGaN well layer/GaN barrier layer.

As shown in FIG. 2, by way of example, the nitride-based light emitting device according to this embodiment may include a strain buffer layer, which includes three pairs of a 100 Å thick quantum-barrier layer and a 30 Å thick quantum-well layer alternately stacked one above another, wherein the quantum-barrier layer is comprised of GaN having an indium content of 0 atom % and the quantum-well layer is comprised of InGaN having an indium content of 10 atom % in "a" of FIG. 2. Further, the nitride-based light emitting device may include an active layer, which includes six pairs of a 100 Å thick quantum-barrier layer and a 30 Å thick quantum-well layer alternately stacked one above another, wherein the quantum-barrier layer is comprised of GaN having an indium content of 0 atom % and the quantum-well layer is comprised of InGaN having an indium content of 12 atom % in "b" of FIG. 2.

In this case, the number of pairs may be variously modified. Particularly, so long as the average indium content of the strain buffer layer in "a" satisfies 2.7 atom % and the average indium content of the active layer in "b" is in the range of 3.5 to 5.7 atom %, the indium content in each of the strain buffer layer and the active layer in each of "a" and "b" may be randomly changed, as shown in FIG. 3. Although not shown in the drawings, it should be understood that the present invention includes modifications wherein the average indium content of the strain buffer layer satisfies 2.7 atom % even when any one layer has a much lower indium content than that of the other layer in "a".

Each of the first and second electrodes 160, 170 is connected to an external power source (not shown) to apply voltage to the first and second nitride semiconductor layers 120, 150. In this embodiment, the light emitting device is shown as having a horizontal structure in which the first electrode 160 and the second electrode 170 are disposed in a horizontal direction.

The first electrode 160 electrically contacts the first nitride semiconductor layer 120. More specifically, the first electrode 160 may be formed by forming the second nitride semiconductor layer 150, etching the second nitride semiconductor layer 150 to expose the first nitride semiconductor layer 120, and patterning the first electrode on the expose surface of the first nitride semiconductor layer 120.

The second electrode 170 electrically contacts the second nitride semiconductor layer 150. The second electrode 170 may be formed on the second nitride semiconductor layer 150 by patterning.

The first electrode 160 and the second electrode 170 may be formed of metal such as gold (Au), silver (Ag), copper (Cu), chromium (Cr), titanium (Ti), tungsten (W), nickel (Ni), silicon (Si), aluminum (Al), molybdenum (Mo), and the like, or alloys thereof.

In this way, in the nitride-based light emitting device 100 according to the embodiment of the invention, the strain buffer layer 130 is formed under the active layer 140 so as to have the ratio B/A in the range of 1.4<B/A<6.1, thereby minimizing strain of the active layer 140.

As a result, the active layer 140 has a reduced piezoelectric field and improved crystallinity, whereby recombination efficiency of electrons and holes in the active layer 140 can be improved, thereby improving light emitting efficiency of the active layer 140.

Meanwhile, although the first and second nitride semiconductor layers 120, 150 are illustrated as being respectively formed of the n-type and p-type nitride semiconductor layers in this embodiment, it should be understood that the first and second nitride semiconductor layers may be formed of the p-type and n-type nitride semiconductor layers, respectively.

Figure 4:
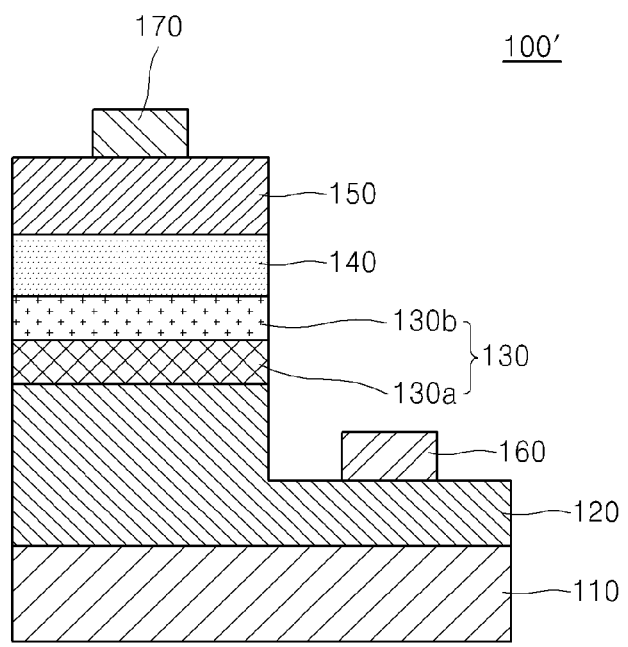
FIG. 4 is a sectional view of a nitride-based light emitting device in accordance with another embodiment of the present invention.
Figure 5:
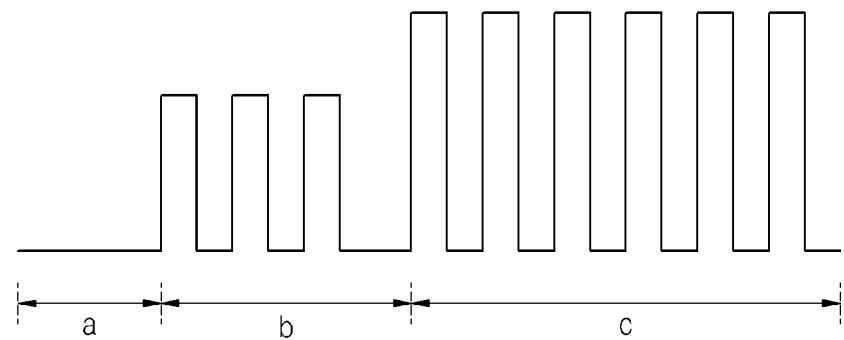
FIG. 5 shows indium profiles of an active layer and a strain buffer layer in the nitride-based light emitting device of FIG. 4, in accordance with one embodiment of the present invention.

FIG. 4 is a sectional view of a nitride-based light emitting device in accordance with another embodiment of the present invention; FIG. 5 shows indium profiles of an active layer and a strain buffer layer in the nitride-based light emitting device of FIG. 4, in accordance with one embodiment of the present invention; and FIG. 6 shows indium profiles of the active layer and the strain buffer layer in the nitride-based light emitting device of FIG. 4, in accordance with another embodiment of the present invention.

Figure 6:
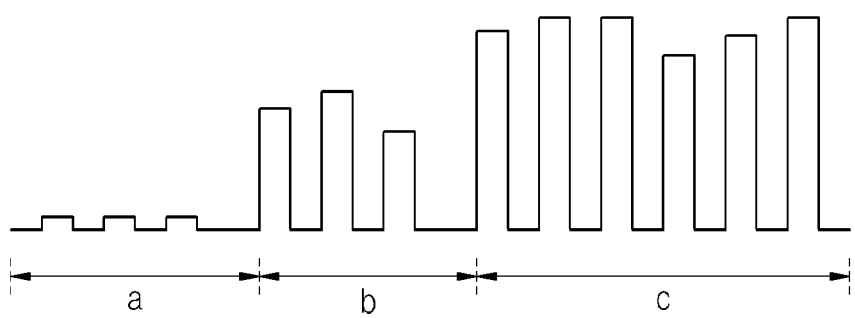
FIG. 6 shows indium profiles of the active layer and the strain buffer layer in the nitride-based light emitting device of FIG. 4, in accordance with another embodiment of the present invention.

Referring to FIG. 4 to FIG. 6, a nitride-based light emitting device 100' according to this embodiment includes a first nitride semiconductor layer 120, a second nitride semiconductor layer 150, an active layer 140 interposed between the first and second semiconductor layers 120, 150, and a multi-layer strain buffer layer 130 interposed between the first nitride semiconductor layer 120 and the active layer 140.

The nitride-based light emitting device 100' may further include a first electrode 160 electrically connected to the first nitride semiconductor layer 120 and a second electrode 170 electrically connected to the second nitride semiconductor layer 150.

In addition, the nitride-based light emitting device 100' may include a substrate 110 under the first nitride semiconductor layer 120. Further, although not shown in the drawings, a buffer layer, a non-doped nitride layer, and the like may be formed between the substrate 110 and the first nitride semiconductor layer 120.

In the nitride-based light emitting device 100', first and second strain buffer layers 130a, 130b are formed to gradually relieve strain in the active layer 140 and will be defined by all layers containing indium, the content of which is less than an average indium content of the active layer 140.

The nitride-based light emitting device 100' according to this embodiment is the same as the nitride-based light emitting device 100 according to the embodiment described above except for the multilayer structure of the strain buffer layer 130, and thus a repeated description will be omitted herein except for the multilayer strain buffer layer 130.

The strain buffer layer 130 of the nitride-based light emitting device 100' is formed by sequentially stacking the first strain buffer layer 130a and the second strain buffer layer 130b in an upward direction.

Since the second strain buffer layer 130b is substantially the same as the strain buffer layer 130 of the nitride-based light emitting device 100, a description thereof will be omitted.

The nitride-based light emitting device 100' includes InGaN, the average indium (In) content of which forms an increasing gradient from the first strain buffer layer 130a to the second strain buffer layer 130b and the active layer 140 in order to gradually relieve strain of the active layer 140.

Specifically, the first strain buffer layer 130a may be a 100 to 5000 Å thick bulk layer comprised of InGaN, the average indium content of which is lower than that of the second strain buffer layer 130b in order to gradually relieve strain of the active layer 140. Here, the first strain buffer layer 130a may be represented by $In_xGa_{1-x}N$ ($0 < x \leq 1$).

The first strain buffer layer 130a may be a single bulk layer or multiple bulk layers comprised of InGaN and having a thickness of 100 to 5000 Å, or may have a multi-quantum well (MQW) structure in which a plurality of quantum-well layers and a plurality of quantum-barrier layers are alternately stacked one above another. In this case, the multi-quantum well structure of the first strain buffer layer 130a may be formed of pairs of InGaN well layer/GaN barrier layer.

Thus, the average indium content of the second strain buffer layer 130b is higher than that of the first strain buffer layer 130a and is lower than that of the active layer 140.

Strain minimization of the active layer 140 may be achieved by adjusting the thickness and the indium content of each of the first and second strain buffer layers 130a, 130b and the active layer 140. That is, a principle wherein the average indium content increases with decreasing thickness of the quantum-barrier layer is applied. However, if the indium content in each of the first and second strain buffer layers 130a, 130b is excessively high, there can be a problem of deterioration in strain characteristics of the active layer 140.

In particular, this embodiment of the present invention provides conditions for achieving light emitting efficiency approaching 100% by minimizing strain of the active layer 140 with reference to Table 1 below. In this embodiment, the light emitting device is characterized in that the ratio A/C satisfies 0.3<A/C<1.8 and the ratio B/A satisfies 1.4<B/A<6.1, where C is the product of an average indium content of the first strain buffer layer 130a and a thickness of the first strain buffer layer 130a, A is the product of an average indium content of the second strain buffer layer 130b and a thickness of the second strain buffer layer 130b, and B is the product of an average indium content of the active layer 140 and a thickness of the active layer 140.

Test results showed that, when the strain buffer layer 130 includes the first and second strain buffer layers 130a, 130b while satisfying 0.3<A/C<1.8 and 1.4<B/A<6.1, the light emitting device had high light output, and when the ratios were not within these ranges, the light emitting device had relatively low light output.

Next, one example of the strain buffer layer 130 including the first and second strain buffer layers 130a, 130b according to this embodiment will be described together with indium profiles in the first and second strain buffer layers 130a, 130b and the active layer 140. However, it should be understood that the present invention is not limited to the following example so long as the active layer and the first and second strain buffer layers are formed to have the ratios in the ranges of 0.3<A/C<1.8 and 1.4<B/A<6.1.

As shown in FIG. 5, by way of example, the nitride-based light emitting device according to this embodiment may include a first strain buffer layer formed 3000 Å thick by using InGaN having an indium content of less than 1 atom % in "a" of FIG. 5. Further, the light emitting device according to this embodiment may include a second strain buffer layer, which includes three pairs of a 100 Å thick quantum-barrier layer and a 30 Å thick quantum-well layer alternately stacked one above another, wherein the quantum-barrier layer is comprised of GaN having an indium content of 0 atom % and the quantum-well layer is comprised of InGaN having an indium content of 10 atom % in "b" of FIG. 5. Further, the light emitting device may include an active layer, which includes six pairs of a 100 Å thick quantum-barrier layer and a 30 Å thick quantum-well layer alternately stacked one above another, wherein the quantum-barrier layer is comprised of GaN having an indium content of 0 atom % and the quantum-well layer is comprised of InGaN having an indium content of 12 atom % in "c" of FIG. 5.

In this case, the number of pairs may be variously modified. Particularly, so long as the average indium content of the first strain buffer layer in "a" satisfies 0.2 to 1.2 atom %, the average indium content of the second strain buffer layer in "b" satisfies 2.7 atom % and the average indium content of the active layer in "c" is in the range of 3.5 to 5.7 atom %, the indium content in each of the first and second strain buffer layers and the active layer in each of "a", "b" and "c" may be randomly changed, as shown in FIG. 6. Although not shown in the drawings, it should be understood that the present invention includes modifications wherein the average indium content of the second strain buffer layer satisfies 2.7 atom % even when any one layer has a much lower indium content than that of the other layer in "b".

In this way, in the nitride-based light emitting device 100' according to this embodiment, the multilayer strain buffer layer 130 including the first and second strain buffer layers 130a, 130b is formed under the active layer 140 so as to have the ratios of A/C and B/A in the ranges of 0.3<A/C<1.8 and 1.4<B/A<6.1, thereby gradually relieve strain of the active layer 140.

As a result, the active layer 140 has a reduced piezoelectric field and improved crystallinity, whereby recombination efficiency of electrons and holes in the active layer 140 can be improved, thereby improving light emitting efficiency of the active layer 140.

Next, light output of the light emitting device will be evaluated by changing the average indium content and the thickness of each of the first and second strain buffer layer and the active layer, and results are show in Table 1. Here, the second strain buffer layer is substantially the same as the strain buffer layer of the light emitting device according to the embodiment described above.

TABLE 1

| Item | First strain buffer layer In content (%) | First strain buffer layer T (nm) | First strain buffer layer P × T (C) | Second strain buffer layer In content (%) | Second strain buffer layer T (nm) | Second strain buffer layer P × T (A) | Active layer In content (%) | Active layer T (nm) | Active layer P × T (B) | Ratio A/C | Ratio B/A | Light output PO (Mw) | Light output Ratio (%) |
|---|---|---|---|---|---|---|---|---|---|---|---|---|---|
| Ref | 0.4 | 300 | 1.2 | 2.7 | 40.5 | 1.1 | 3.5 | 81 | 2.8 | 0.9 | 2.6 | 190 | 100 |
| First strain buffer layer content 0.5 times | 0.2 | 300 | 0.6 | 2.7 | 40.5 | 1.1 | 3.5 | 81 | 2.8 | 1.8 | 2.6 | 180 | 95 |
| First strain buffer layer content 1.5 times | 0.6 | 300 | 1.8 | 2.7 | 40.5 | 1.1 | 3.5 | 81 | 2.8 | 0.6 | 2.6 | 190 | 100 |
| First strain buffer layer content 3 times | 1.2 | 300 | 3.6 | 2.7 | 40.5 | 1.1 | 3.5 | 81 | 2.8 | 0.9 | 2.6 | 180 | 95 |
| Thickness of first strain buffer layer decreased by 100 nm | 0.6 | 200 | 1.2 | 2.7 | 40.5 | 1.1 | 3.0 | 81 | 2.4 | 0.9 | 2.2 | 188 | 99 |
| Thickness of first strain buffer layer decreased by 200 nm | 0.6 | 100 | 0.6 | 2.7 | 40.5 | 1.1 | 3.5 | 81 | 2.8 | 1.8 | 2.6 | 178 | 94 |
| Indium content of second strain buffer layer increased by 12% | 0.6 | 300 | 1.8 | 3.2 | 40.5 | 1.3 | 3.5 | 54 | 1.9 | 0.7 | 1.4 | 165 | 87 |
| Thickness of one pair in active layer decreased to 30 Å | 0.6 | 300 | 1.8 | 2.7 | 40.5 | 1.1 | 5.7 | 48 | 2.7 | 0.6 | 2.5 | 190 | 100 |
| Thickness of one pair in active layer decreased to 100 Å | 0.6 | 300 | 1.8 | 2.7 | 40.5 | 1.1 | 4.6 | 60 | 2.7 | 0.6 | 2.5 | 190 | 100 |
| Thickness of one pair in active layer decreased to 120 Å | 0.6 | 300 | 1.8 | 2.7 | 40.5 | 1.1 | 3.8 | 72 | 2.7 | 0.6 | 2.5 | 190 | 100 |
| Number of pairs in active layer increased (6→8) | 0.6 | 300 | 1.8 | 2.7 | 40.5 | 1.1 | 3.5 | 108 | 3.8 | 0.6 | 3.5 | 190 | 100 |
| Number of pairs in active layer increased (6→10) | 0.6 | 300 | 1.8 | 2.7 | 40.5 | 1.1 | 3.5 | 135 | 4.7 | 0.6 | 4.3 | 190 | 100 |
| Number of pairs in active layer increased (6→12) | 0.6 | 300 | 1.8 | 2.7 | 40.5 | 1.1 | 3.5 | 162 | 5.7 | 0.6 | 5.2 | 188 | 99 |
| Number of pairs in active layer increased (6→14) | 0.6 | 300 | 1.8 | 2.7 | 40.5 | 1.1 | 3.5 | 189 | 6.6 | 0.6 | 6.1 | 175 | 92 |

In this table, "In content" means an average content of indium (atom %) in total indium and gallium atoms, "T" means thickness, "P" means "content", and "ref." means a reference light emitting device wherein the first strain buffer layer has an average content/thickness of 0.4 atom %/300 nm, the second strain buffer layer is comprised of 6 pairs of InGaN/GaN SLs (supper lattice) (In content of 10 atom %, each pair having a thickness of 135 Å), and the active layer is comprised of 6 pairs of InGaN/GaN, (In content of 12 atom %, each pair having a thickness of 135 Å). The light emitting device samples were prepared by changing the indium content and thickness of the first strain buffer layer, the thickness of one pair in the active layer, or the number of pairs in the active layer, and were compared with the reference light emitting device.

Referring to Table 1, it can be seen that, when the ratio A/C was 0.6 or 0.9, the light emitting device had a higher light output of 100% or 99%, and when the ratio A/C was 0.3 or 1.8, the light emitting device had a lower light output of 95% or 94%.

In addition, it can also be seen that, when the ratio A/C was 0.6~0.7, the light output in a B/A value of 1.4 and the light output in a B/A value of 6.1 were 87% and 92%, respectively, which were lower than a light output in the range of 99~100% when the ratio B/A was 2.5, 3.5, 4.3, or 5.2.

According to the test results, when the nitride-based light emitting device includes the second strain layer and the active layer having an InGaN/GaN structure, it is desirable that the ratio B/A satisfy 1.4<B/A<6.1. Further, when the nitride-based light emitting device includes the first and second strain buffer layers and the active layer, it is desirable that the ratio A/C satisfy 0.3<A/C<1.8 and the ratio B/A satisfy 1.4<B/A<6.1. Within these ranges, the active layer of the light emitting device may relieve strain and thus have improved internal quantum efficiency, thereby improving light emitting efficiency.

Although some exemplary embodiments have been described herein, it should be understood by those skilled in the art that these embodiments are given by way of illustration only, and that various modifications, variations and alterations can be made without departing from the spirit and scope of the present invention. Therefore, the scope of the present invention should be limited only by the accompanying claims and equivalents thereof.

What is claimed is:

1. A nitride-based light emitting device, comprising:
 a first nitride semiconductor layer doped with a first conductive impurity;
 a strain buffer layer formed on the first nitride semiconductor layer and comprising-InGaN;
 an active layer formed on the strain buffer layer and having a multi-quantum well structure in which a quantum-well layer and a quantum-barrier layer are alternately stacked one above another, the active layer comprising InGaN; and
 a second nitride semiconductor layer formed on the active layer and doped with a second conductive impurity opposite to the first conductive impurity,
 wherein the ratio B/A satisfies 1.4<B/A<6.1, where:
A is the product of an average indium content of the strain buffer layer and a thickness of the strain buffer layer; and
B is the product of an average indium content of the active layer and a thickness of the active layer,
wherein the average indium content of the strain buffer layer is lower than the average indium content of the active layer, and
wherein the strain buffer layer includes a quantum-well layer and a quantum-barrier layer alternately stacked one above another,
wherein the strain buffer layer comprises:
a first strain buffer layer, and
a second strain buffer layer formed under the first strain buffer layer,
wherein the ratio B/A with respect to the first strain buffer layer satisfies 1.4<B/A<6.1, and
the ratio A/C satisfies 0.3<A/C<1.8,
where C is the product of an average indium content of the second strain buffer layer and a thickness thereof, and
wherein the average indium content of the second strain buffer layer is lower than the average indium content of the first strain buffer layer.

2. The nitride-based light emitting device according to claim 1, wherein the quantum-well layer of the strain buffer layer comprises InGaN and the quantum-barrier layer of the strain buffer layer comprises GaN.

3. The nitride-based light emitting device according to claim 1, wherein the quantum-well layer of the strain buffer layer comprises InGaN and the quantum-barrier layer of the strain buffer layer comprises GaN.

4. The nitride-based light emitting device according to claim 1, wherein the quantum-well layer of the second strain buffer layer comprises InGaN and the quantum-barrier layer of the second strain buffer layer comprises GaN.

5. The nitride-based light emitting device according to claim 1, wherein the second strain buffer layer has a thickness of 100Å to 5000 Å.

6. The nitride-based light emitting device according to claim 1, wherein the first nitride semiconductor layer is doped with n-type impurities, and the second nitride semiconductor layer is doped with p-type impurities.

* * * * *